(12) United States Patent
Ishii

(10) Patent No.: US 10,799,896 B2
(45) Date of Patent: Oct. 13, 2020

(54) SUBSTRATE PROCESSING APPARATUS, METHOD OF COATING PARTICLE IN PROCESS GAS NOZZLE AND SUBSTRATE PROCESSING METHOD

(71) Applicant: TOKYO ELECTRON LIMITED, Tokyo (JP)

(72) Inventor: Katsutoshi Ishii, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 26 days.

(21) Appl. No.: 15/956,225

(22) Filed: Apr. 18, 2018

(65) Prior Publication Data
US 2018/0304286 A1    Oct. 25, 2018

(30) Foreign Application Priority Data

Apr. 21, 2017 (JP) .................. 2017-084748

(51) Int. Cl.
| | | |
|---|---|---|
| B05B 7/04 | (2006.01) | |
| H01L 21/67 | (2006.01) | |
| B05B 5/053 | (2006.01) | |
| C23C 16/40 | (2006.01) | |
| C23C 16/455 | (2006.01) | |
| B05B 7/06 | (2006.01) | |
| C23C 16/44 | (2006.01) | |

(52) U.S. Cl.
CPC .......... *B05B 7/0433* (2013.01); *B05B 5/0533* (2013.01); *B05B 7/066* (2013.01); *C23C 16/402* (2013.01); *C23C 16/4404* (2013.01); *C23C 16/4405* (2013.01); *C23C 16/4412* (2013.01); *C23C 16/45544* (2013.01); *C23C 16/45563* (2013.01); *C23C 16/45578* (2013.01); *H01L 21/67017* (2013.01); *H01L 21/67034* (2013.01); *H01L 21/67109* (2013.01); *H01L 21/67161* (2013.01); *H01L 21/67184* (2013.01)

(58) Field of Classification Search
None
See application file for complete search history.

(56) References Cited

U.S. PATENT DOCUMENTS

| | | | | |
|---|---|---|---|---|
| 5,614,247 | A | * | 3/1997 | Barbee ............... C23C 16/403 427/126.4 |
| 6,796,316 | B2 | | 9/2004 | Park |
| 2010/0186667 | A1 | | 7/2010 | Ishii et al. |

FOREIGN PATENT DOCUMENTS

JP    5194036 B2    2/2013

* cited by examiner

*Primary Examiner* — Eric W Golightly
(74) *Attorney, Agent, or Firm* — Nath, Goldberg & Meyer; Jerald L. Meyer

(57) ABSTRACT

There is provided a substrate processing apparatus that includes: a process chamber in which a substrate is accommodated to be processed; a plurality of quartz gas nozzles configured to supply, into the process chamber, a plurality of process gasses capable of generating reaction products by reacting the plurality of process gasses with each other; an evacuation device configured to evacuate an interior portion of the process chamber; a bypass pipe configured to connect a quartz gas nozzle among the plurality of quartz gas nozzles to the evacuation device; and a coating gas nozzle configured to supply at least one of a silicon-containing gas and an oxidizing gas capable of forming a $SiO_2$ coating film inside the quartz gas nozzle connected to the evacuation device in a state in which the inside of the quartz gas nozzle connected to the evacuation device is evacuated by the evacuation device.

12 Claims, 4 Drawing Sheets

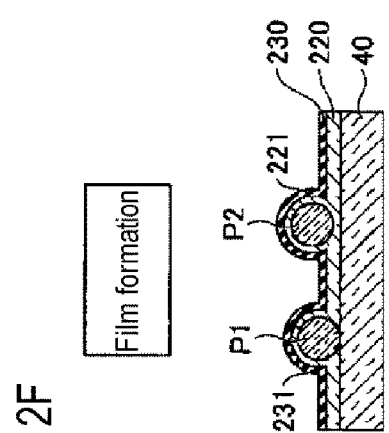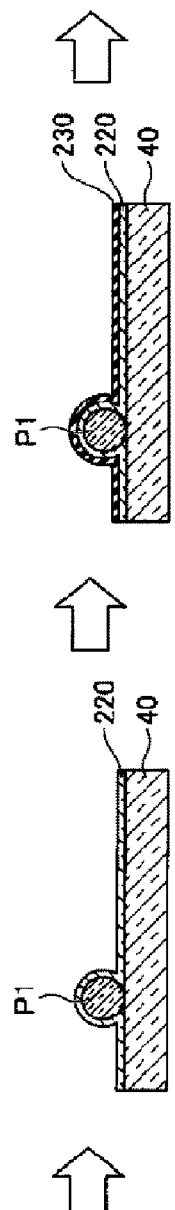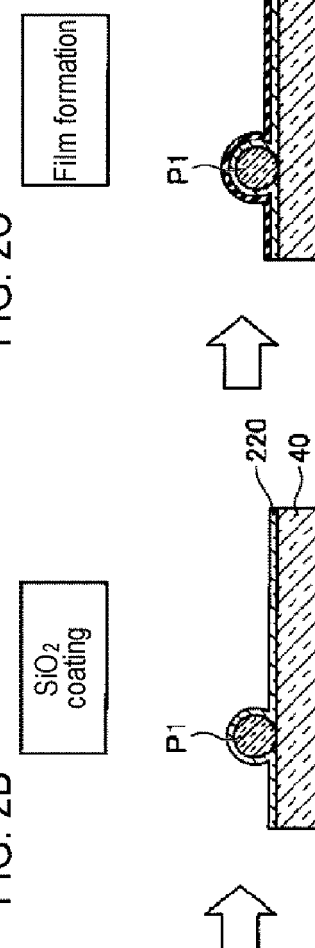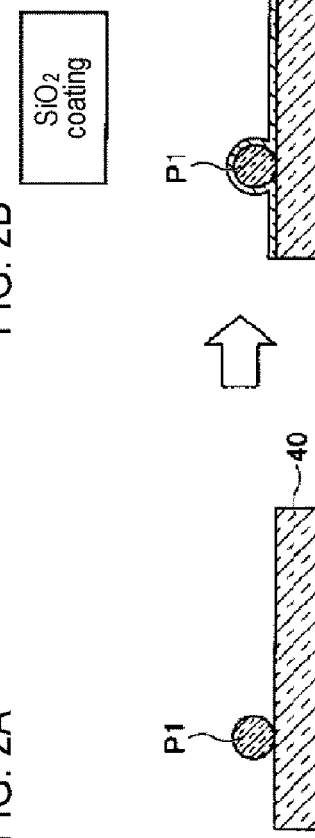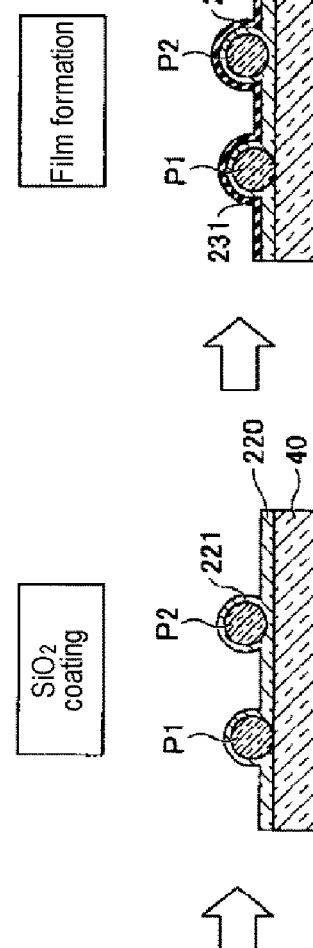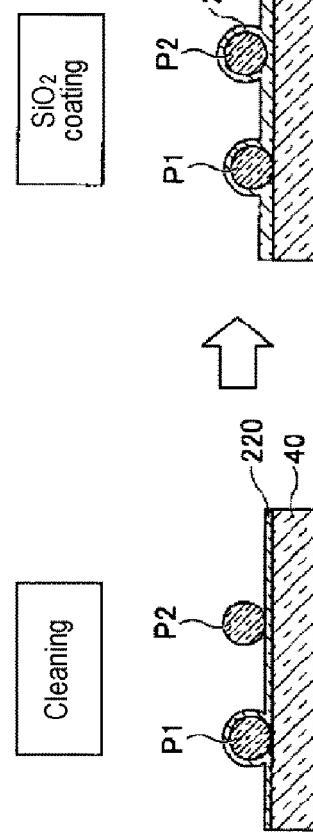

SUBSTRATE PROCESSING APPARATUS, METHOD OF COATING PARTICLE IN PROCESS GAS NOZZLE AND SUBSTRATE PROCESSING METHOD

CROSS-REFERENCE TO RELATED APPLICATION(S)

This application is based upon and claims the benefit of priority from Japanese Patent Application No. 2017-084748, filed on Apr. 21, 2017, the entire contents of which are incorporated herein by reference.

TECHNICAL FIELD

The present disclosure relates to a substrate processing apparatus, a method of coating particles in a process gas nozzle and a substrate processing method.

BACKGROUND

A cleaning method has been used for a substrate processing apparatus including a reaction tube configured to perform predetermined processing on a substrate, a plurality of nozzles configured to supply reaction gasses into the reaction tube and a cleaning nozzle installed separately from the plurality of nozzles and configured to supply a cleaning gas into the reaction tube. In the case of cleaning the interior of the nozzles, a nozzle to be cleaned is sequentially selected, the cleaning gas is supplied to the selected nozzle, inert gas is supplied to the unselected nozzles, and inert gas is supplied to the selected nozzle after the cleaning gas is supplied to the selected nozzle. In the case of cleaning the interior of the reaction tube, the cleaning gas is supplied into the reaction tube from at least the cleaning nozzle, and inert gas is supplied to the nozzles which have been cleaned.

In such a cleaning method, the cleaning gas is supplied into the nozzles to clean the interior of the nozzles. When cleaning the reaction tube, the inert gas is supplied to the nozzles which have been cleaned, thereby preventing over-etching of inner walls of the nozzles.

In a configuration of a related art described above, since the interior of the nozzle is cleaned by using the cleaning gas, it is possible to prevent generation of particles originated from film formation, i.e., particles generated due to peeling of a film. However, there is a problem that it is impossible to remove particles peeled off due to weakening of a glass surface of a nozzle made of quartz, i.e., particles originated from quartz. That is, for example, even if only one type of silicon-containing gas is supplied from a nozzle for supplying a silicon-containing gas for film formation, another gas dispersed in the reaction tube is introduced from the discharge holes of the nozzle. Reaction products are generated by a reaction with the silicon-containing gas for film formation. Thus, a film may be formed inside the nozzle in some cases.

Although the peeling of such a film is also a cause of generation of particles, stress may be applied to the inside of the nozzle due to repeated expansion and contraction of the film. Thus, a surface of quartz glass constituting the nozzle may be weakened. Quartz pieces thus generated may generate particles. It is possible to remove the particles originated from the film with the cleaning gas, however, it is not possible for the cleaning gas to suppress the particles generated from quartz.

SUMMARY

Some embodiments of the present disclosure provide a technique capable of effectively suppressing particles generated in a nozzle, including particles originated from quartz.

According to one embodiment of the present disclosure, there is provided a technique that includes: a process chamber in which a substrate is accommodated to be processed, the process chamber having an interior portion; a plurality of quartz gas nozzles configured to supply, into the process chamber, a plurality of process gasses capable of generating reaction products by reacting the plurality of process gasses with each other; an evacuation device configured to evacuate the interior portion of the process chamber; at least one bypass pipe configured to connect a quartz gas nozzle among the plurality of quartz gas nozzles to the evacuation device; and at least one coating gas nozzle configured to supply, into the process chamber, at least one of a silicon-containing gas and an oxidizing gas capable of forming a $SiO_2$ coating film inside the quartz gas nozzle connected to the evacuation device in a state in which the inside of the quartz gas nozzle connected to the evacuation device is evacuated by the evacuation device.

According to other embodiment of the present disclosure, there is provided a technique that includes: connecting at least one quartz gas nozzle to an evacuation device via at least one bypass pipe, the at least one quartz gas nozzle being installed in a process chamber and configured to supply process gas into the process chamber; evacuating an interior portion of the at least one quartz gas nozzle via the at least one bypass pipe by the evacuation device; and forming a $SiO_2$ coating film as a reaction product of a silicon-containing gas and an oxidizing gas inside the at least one quartz gas nozzle by supplying the silicon-containing gas and the oxidizing gas into the process chamber while continuing to evacuate the interior portion of the at least one quartz gas nozzle.

According to another embodiment of the present disclosure, there is provided a technique that includes: coating particles in a quartz gas nozzle with a $SiO_2$ coating film by the method of coating particles in a process gas nozzle described above; evacuating an interior portion of the process chamber by switching the connection of the evacuation device from the at least one bypass pipe to the process chamber; loading a substrate into the process chamber; performing a film-forming process on a surface of the substrate by supplying, into the process chamber, a plurality of process gas capable of generating reaction products by reacting the plurality of gasses with each other; and unloading the substrate, to which the film-forming process is performed, from the process chamber.

BRIEF DESCRIPTION OF DRAWINGS

The accompanying drawings, which are incorporated in and constitute a part of the disclosure, illustrate embodiments of the present disclosure, and together with a general description given above and a detailed description of the embodiments given below, serve to explain principles of the present disclosure.

FIGS. 2A to 2F are views for explaining a principle of a method of coating particles in a process gas nozzle and a substrate processing method according to an embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, modes for carrying out the present disclosure will be described with reference to the drawings.

Figure 1:
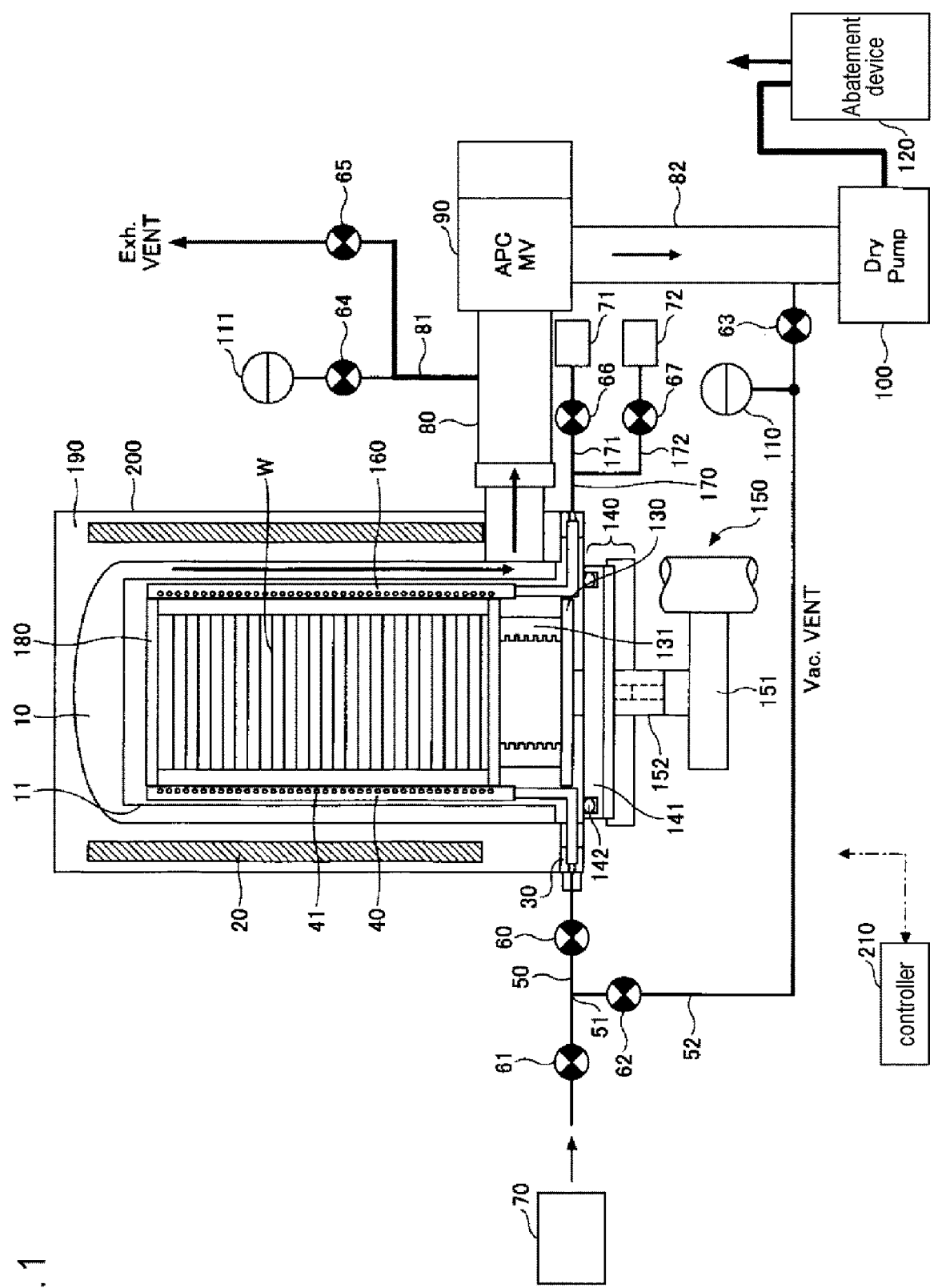
FIG. 1 is a view showing an example of a substrate processing apparatus according to an embodiment of the present disclosure.

FIG. 1 is a view showing an example of a substrate processing apparatus according to an embodiment of the present disclosure. As illustrated in FIG. 1, a substrate processing apparatus according to the present embodiment includes a reaction tube 10, an inner tube 11, a heater 20, a manifold 30, a process gas nozzle 40, a process gas supply pipe 50, a bypass pipe 52, valves 60 to 67, a process gas supply source 70, a silicon-containing gas supply source 71, an oxidizing gas supply source 72, exhaust pipes 80 and 82, a branch exhaust pipe 81, an automatic pressure control valve 90, a vacuum pump 100, pressure gauges 110 and 111, an abatement device 120, a table 130, a mounting stand 131, a lid 140, an elevating mechanism 150, a coating gas nozzle 160, coating gas supply pipes 170 to 172, a wafer boat 180, a heat insulating material 190, a housing 200, and a controller 210. Furthermore, the process gas nozzle 40 has discharge holes 41, and the lid 140 has a flange portion 141. The elevating mechanism 150 has an arm 151 and a rotating shaft 152. In addition, a plurality of wafers W are mounted on the wafer boat 180.

The substrate processing apparatus illustrated in FIG. 1 is configured as a vertical heat treatment apparatus that holds a plurality of wafers W on the wafer boat 180 in a state of being spaced apart from each other at a predetermined interval in a vertical direction and performs a film-forming process on the wafers W by heating the wafers W with the heater 20 while supplying process gas from the process gas nozzle 40 into the reaction tube 10, more precisely the inner tube 11. The substrate processing apparatus according to the present embodiment may be any of various substrate processing apparatuses as long as it is a substrate processing apparatus that performs substrate processing using a process gas nozzle. In the present embodiment, however, an example in which the substrate processing apparatus is configured as a vertical heat treatment apparatus will be described.

The reaction tube 10 and the inner tube 11 are process chambers in which the wafers W mounted on the wafer boat 180 are accommodated, and for performing a heat treatment on the wafers W. The reaction tube 10 and the inner tube 11 have a substantially cylindrical shape and have a height such that several tens to one hundred wafers W mounted on the wafer boat 180 in the vertical direction can be batch-processed at once. The reaction tube 10 and the inner tube 11 may be made of various materials, for example, quartz. Although not illustrated in FIG. 1, a ceiling of the inner tube 11 is opened, or a slit is formed on a side surface of the inner tube 11 on a side of the exhaust pipe 80, such that an inside of the inner tube 11 is configured to be evacuated by the vacuum pump 100.

A lower end, i.e., a bottom surface of the reaction tube 10 is opened, and loading and unloading of the wafer boat 180 holding the wafers W is performed from a lower end opening.

The heater 20 is installed around the reaction tube 10 and is a heating mechanism for heating the wafers W loaded into the inner tube 11 from the outside.

The manifold 30 is a part to which the process gas supply pipe 50 for supplying process gas to the process gas nozzle 40 installed inside the reaction tube 10 is connected. That is, the manifold 30 is configured such that the process gas supply pipe 50 can be connected to the manifold 30 from the outside and the process gas supply pipe 50 thus connected can communicate with the process gas nozzle 40 installed within the reaction tube 10. In addition, the manifold 30 has a shape protruding to an outer peripheral side similar to a flange.

The process gas nozzle 40 is a gas supply mechanism for supplying process gas to the inside of the reaction tube 10, more precisely the inner tube 11. The process gas nozzle 40 is made of quartz and may be referred to as a quartz gas nozzle 40. The process gas nozzle 40 is inserted into the inner tube 11 from the manifold 30 and vertically extends along an inner circumferential surface of the inner tube 11. The process gas nozzle 40 is configured such that process gas can be supplied to the wafers W from a plurality of discharge holes 41 formed facing inward. When the substrate processing apparatus performs a film-forming process, a gas necessary for film formation is supplied. When the substrate processing apparatus performs other processes, a process gas according to each application is supplied.

Although only one process gas nozzle 40 is illustrated in FIG. 1 for the convenience of illustration, a plurality of process gas nozzles 40 may be provided. In the case where the substrate processing performed by the substrate processing apparatus is a film-forming process, it is often the case that plural types of reaction products are supplied by reacting the plurality of gasses with each other. In the case of process gas for film formation, it is often the case that a raw material gas such as a silicon-containing gas, an organic metal-containing gas or the like and an oxidizing gas for oxidizing the raw material gas or a nitriding gas for nitriding the raw material gas are used in combination. As the oxidizing gas, for example, ozone, oxygen, water or the like is used. As the nitriding gas, ammonia is used in many cases. In addition, a process gas nozzle 40 to supply a purge gas used for purging the wafers W may be installed. As the purge gas, in addition to inert gas represented by nitrogen gas, a rare gas such as Ar, He or the like may also be used. In the case where a plurality of process gas nozzles 40 are installed, the process gas nozzles 40 may be arranged along a circumferential direction of the substantially cylindrical reaction tube 10.

The other end of the process gas supply pipe 50 not connected to the reaction tube 10 is connected to the process gas supply source 70 such that process gas can be supplied from the process gas supply source 70 to the process gas nozzle 40 via the process gas supply pipe 50.

The bypass pipe 52 branches from a branch point 51 of the process gas supply pipe 50. The bypass pipe 52 is connected to the exhaust pipe 82 and is connected to the vacuum pump 100 via the exhaust pipe 82. The bypass pipe 52 is a pipe used for removing particles in the process gas nozzle 40.

Valves 60 and 61 are installed in the process gas supply pipe 50. Valves 62 and 63 are installed in the bypass pipe 52. The valve 60 is a valve used when cutting off a connection between the process gas supply source 70 and the process gas nozzle 40. In the present embodiment, the valve 60 is not indispensable and may be installed as necessary. The valve 61 is a valve for cutting off a connection between the bypass pipe 52 and the process gas supply source 70. The valve 61 may be closed when removing particles in the process gas nozzle 40 and may be opened in other cases.

The valve 62 is a valve for switching a connection and a disconnection between the bypass pipe 52 and the process gas supply pipe 50. The valve 63 is a valve for switching a connection and a disconnection between the bypass pipe 52 and the exhaust pipe 82. The valve 63 is not indispensable in the present embodiment and may be installed as necessary.

Details of the operations of the valve 60 to 63 will be described later.

The process gas supply source 70 is a gas storage source for supplying process gas to the process gas nozzle 40. The process gas supply source 70 may supply various process gasses to the process gas nozzle 40 depending on applications. For example, the process gas supply source 70 may supply a raw material gas used when performing a film-forming process on the process gas nozzle 40.

The exhaust pipes 80 and 82 are conduits for evacuating the interior of the reaction tube 10. The exhaust pipes 80 and 82 are connected to an evacuation device such as a vacuum pump 100 or the like such that the interior of the reaction tube 10 can be evacuated. The automatic pressure control valve 90 for automatically regulating a pressure is installed in the middle route of the exhaust pipes 80 and 82.

The bypass pipe 52 is connected to the exhaust pipe 82 between the automatic pressure control valve 90 and the vacuum pump 100. Thus, the inside of the process gas nozzle 40 may be evacuated through the exhaust pipe 82 and the bypass pipe 52 using the vacuum pump 100.

The vacuum pump 100 is an evacuation device for evacuating the interior of the reaction tube 10. For example, a dry pump is used as the vacuum pump 100. The vacuum pump 100 is not limited to the dry pump as long as it can evacuate the inside of the reaction tube 10. Various evacuation devices may be used as the vacuum pump 100.

The pressure gauge 110 is installed in the bypass pipe 52 such that a pressure can be measured by the pressure gauge 110.

The branch exhaust pipe 81 is a pipe used for measuring a pressure in the exhaust pipe 80 or for lowering the pressure in the exhaust pipe 80 to bring a pressure in the reaction tube 10 to an atmospheric pressure when the automatic pressure control valve 90 is closed. When measuring the pressure in the exhaust pipe 80, the valve 64 is opened and the pressure is measured by the pressure gauge 111. On the other hand, when lowering the lid 140, the pressure in the reaction tube 10 is brought to atmospheric pressure. In the case where an internal pressure of the reaction tube 10 becomes higher than atmospheric pressure, the valve 65 may be opened to lower the internal pressure of the reaction tube 10.

The abatement device 120 is installed on a downstream side of the vacuum pump 100 and is a device that performs a process for converting harmful substances into harmless substances.

The table 130 is a support table for supporting the mounting stand 131 on which the wafer boat 180 is mounted.

The mounting stand 131 is installed on the table 130 and is a support base for mounting and supporting the wafer boat 180 together with the table 130. The table 130 and the mounting stand 131 may also be made of, for example, quartz.

The lid 140 is a lid member capable of hermetically closing a lower end opening of the reaction tube 10. A flange portion 141 having a sealing material 142 on an upper surface of the flange portion 141 is installed in an upper portion of the lid 140 and is configured to seal an opening of the reaction tube 10. The flange portion 141 may be made of, for example, quartz. Although not illustrated in FIG. 1, the sealing material 142 is in contact with a part of a bottom surface on an outer peripheral side of the reaction tube 10 such that the lid 140 can be closed in a sealed state.

The elevating mechanism 150 is a mechanism for raising and lowering the lid 140, and has the arm 151 and the rotating shaft 152. The rotating shaft 152 is attached to a tip of the arm 151 supported by the elevating mechanism 150. The rotating shaft 152 passes through the lid 140. The table 130 is fixed to a tip of the rotating shaft 152. As a result, substrate processing may be performed while fixing the lid 140 against rotation and rotating the wafer boat 180 by the rotating shaft 152. The elevating mechanism 150 is capable of raising and lowering the wafer boat 180, the lid 140 and the like as a unit, and is configured such that only by the table 130, the mounting stand 131 and the wafer boat 180 can be rotated. The table 130 may be fixedly installed on a side of the lid 140 such that the wafers W can be processed without rotating the wafer boat 180.

Accordingly, the lid 140 is configured to be able to ascend and descend while supporting the wafer boat 180 on which the wafers W are mounted, and is configured so as to be able to hermetically seal the lower end opening of the reaction tube 10 while supporting the wafer boat 180. Therefore, the loading and unloading of the wafer boat 180 into and from the reaction tube 10 is carried out by raising and lowering the lid 140 in a state in which the wafer boat 180 is supported above the lid 140.

The coating gas nozzle 160 is a nozzle for supplying at least one of a silicon-containing gas and an oxidizing gas into the reaction tube 10 so as to coat an inner wall of the process gas nozzle 40 with a $SiO_2$ film before performing a film-forming process. Since the process gas nozzle 40 is made of quartz, by coating the process gas nozzle 40 with $SiO_2$, the same material, it is possible to fix particles in the process gas nozzle 40 without deteriorating the process gas nozzle 40. That is, even if particles are present on the inner wall of the process gas nozzle 40, by forming a $SiO_2$ coating film on the process gas nozzle 40 so as to cover the particles, it is possible to perform a film-forming process while fixing the particles against movement.

The coating gas supply pipes 170 to 172 are pipes for supplying a silicon-containing gas and an oxidizing gas, which are coating gasses, to the coating gas nozzle 160. The coating gas supply pipe 171 is a pipe for supplying a silicon-containing gas, which is connected to the silicon-containing gas supply source 71. In the coating gas supply pipe 171, a valve 66 is installed.

On the other hand, the coating gas supply pipe 172 is a pipe for supplying an oxidizing gas, which is connected to the oxidizing gas supply source 72. In the coating gas supply pipe 172, a valve 67 is installed.

In addition, the coating gas supply pipe 170 is a confluent pipe of the coating gas supply pipe 171 and the coating gas supply pipe 172. When performing film formation by ALD (Atomic Layer Deposition), the silicon-containing gas and the oxidizing gas are alternately supplied. Therefore, either the silicon-containing gas or the oxidizing gas is constantly supplied from the coating gas supply pipe 170.

Details of a switching operation of the coating gas nozzle 160 and the valves 66 and 67 will be described later.

As described above, the wafer boat 180 is a substrate holder capable of holding a plurality of wafers W in a horizontal state and spaced apart at a predetermined interval along the vertical direction. The wafer boat 180 may also be made of, for example, quartz.

The heat insulating material 190 is a part for preventing heat of the heater 20 from leaking to the outside. The heat insulating material 190 is installed so as to cover the reaction tube 10 and the heater 20.

The housing 200 is a housing mechanism for covering the entire vertical heat treatment apparatus. The heat insulating material 190 is filled in the housing 200 to suppress the release of heat to the outside.

The controller 210 is a part for controlling the entire vertical heat treatment apparatus. The controller 210 also controls a switching of an opening and a closing of the valves 60 to 67 and an operation of the vacuum pump 100. The controller 210 may be configured by various arithmetic processing parts. For example, the controller 210 may be configured by a microcomputer including a CPU (Central Processing Unit) and a memory such as a ROM (Read Only Memory), a RAM (Random Access Memory) or the like and operated by a program, or may be configured by an ASIC (Application Specific Integrated Circuit) or the like which is an integrated circuit in which a plurality of functional circuits are combined into one for a specific use. The controller 210 has an arithmetic processing function and may be configured by various parts as long as it can control the entire heat treatment apparatus.

In addition to a configuration illustrated in FIG. 1, the vertical heat treatment apparatus includes a wafer transfer mechanism for transferring a wafer W from a wafer cassette such as a FOUP (Front Opener Unified Pod) or the like to the wafer boat 180, and so forth. Since relevance of these elements to characteristic parts of the substrate processing apparatus according to the present embodiment is small, illustration and description of these elements are omitted in the present embodiment.

Hereinafter, the principle of the method of coating particles in a process gas nozzle and the substrate processing method according to an embodiment of the present disclosure will be described.

FIGS. 2A to 2F are views for explaining the principle of the method of coating particles in a process gas nozzle and the substrate processing method according to the embodiment of the present disclosure.

FIG. 2A is a view showing a state of the inner wall of the process gas nozzle 40 to which particles P1 adhere. The type of particles P1 is not particularly limited, however, it is assumed that the particles P1 are quartz pieces originated from quartz.

FIG. 2B is a view showing a state in which the method of coating particles in the process gas nozzle according to the present embodiment is performed. A SiO$_2$ coating film 220 is formed so as to cover an entire surface of the inner wall of the process gas nozzle 40 including upper parts of the particles P1. Thus, the particles P1 are fixed. This makes it possible to prevent the particles P1 from being sprayed from the process gas nozzle 40 to the wafer W. Since SiO$_2$ is also a compound that constitutes quartz, the SiO$_2$ reinforces the inner surface of the process gas nozzle 40 and has no adverse effect on the process gas nozzle 40. This point differs greatly from a case of coating a film made of foreign substances.

FIG. 2C is a view showing a state in which a film-forming process is performed. In the film-forming process, one of the process gasses used for the film-forming process is supplied from the process gas nozzle 40. However, another of the process gasses diffused in the inner tube 11 is introduced into the process gas nozzle 40, whereby a film 230 for film formation is deposited on the SiO$_2$ coating film 220 to some extent. The particles P1 are fixed in the process gas nozzle 40 even at a time period of the film-forming process and can be prevented from being scattered to the wafer W. The film 230 formed by the film-forming process may be any type. The film 230 may be a silicon oxide film like the SiO$_2$ coating film 220 or a high-k film containing an organometallic element. Further, the film 230 is not limited to the oxide film but may be a nitride film. As described above, the method of coating particles in a process gas nozzle according to the present embodiment may be applied to various processes. Although it is the film-forming process that the particles P1 originated from quartz are likely to be generated, the method of coating particles in a process gas nozzle is effective for all types of particles P1. Thus, the method of coating particles in a process gas nozzle is applicable not only to the film-forming process but also to other substrate processing processes.

FIG. 2D is a view showing a state in which a dry cleaning is performed. After the film-forming process, the formed film 230 may be removed by performing the dry cleaning as necessary. The dry cleaning may be performed for each film formation or may be performed when the accumulated film thickness of the film 230 reaches a predetermined thickness (μm). In this operation, an accumulated film thickness may not be measured inside the process gas nozzle 40. It is sufficient to perform the measurement at any point inside the inner tube 11.

Since the dry cleaning is aimed at removing the film 230 used in the film-forming process, the SiO$_2$ coating film 220 remains without being removed.

There is a possibility that new particles P2 are generated after the dry cleaning. The new particles P2 are placed on the SiO$_2$ coating film 220.

FIG. 2E is a view showing a state in which the method of coating particles in the process gas nozzle is performed for the second time. As a result, the SiO$_2$ coating film 221 is also formed on the new particles P2, whereby the particles P1 and P2 are fixed on the inner wall of the process gas nozzle 40.

FIG. 2F is a view showing a state in which the film-forming process is performed for the second time. Although a film 231 is formed on the SiO$_2$ coating film 221, the particles P1 and P2 remain fixed inside the process gas nozzle 40 and do not adversely affect the film-forming process.

As described above, according to the method of coating particles in a process gas nozzle and the substrate processing method according to the present embodiment, it is possible to fix the particles in the process gas nozzle 40, including the particles originated from quartz. This makes it possible to prevent the particles P1 and P2 from being scattered to the wafer W.

Figure 3:
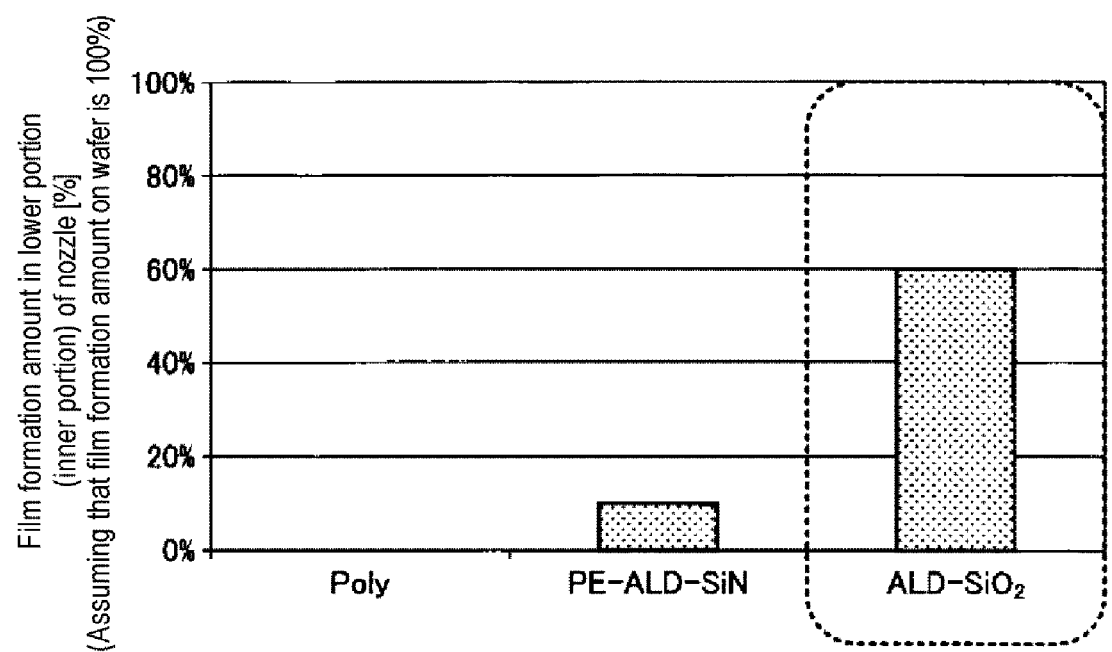
FIG. 3 is a view showing a film formation amount inside a process gas nozzle for each type of film.

FIG. 3 is a view showing a film formation amount inside a process gas nozzle for each type of silicon-containing film. A temperature of a lower portion of the process gas nozzle 40 at a time of film formation is lower than a temperature of an upper portion of the process gas nozzle 40 at which the film formation is performed, making it difficult to form a film on the lower portion of the process gas nozzle 40. However, as illustrated in FIG. 3, even in the lower portion of the process gas nozzle 40 having a relatively low temperature and existing outside a film formation region, a film formation amount of the $SiO_2$ film is remarkably larger than a film formation amount of another type of silicon-containing film (a polysilicon film or a SiN film). In the method of coating particles in a process gas nozzle according to the present embodiment, properties of the $SiO_2$ film capable of being formed even at such a low temperature are used, and the $SiO_2$ coating film is formed inside the process gas nozzle 40 at a low temperature without increasing a temperature inside the reaction tube 10 as in the film formation.

Hereinafter, an operation for carrying out the method of coating particles in a process gas nozzle and the substrate processing method according to the present embodiment using the substrate processing apparatus according to the present embodiment illustrated in FIG. 1, i.e., the vertical heat treatment apparatus, will be described.

Figure 4:
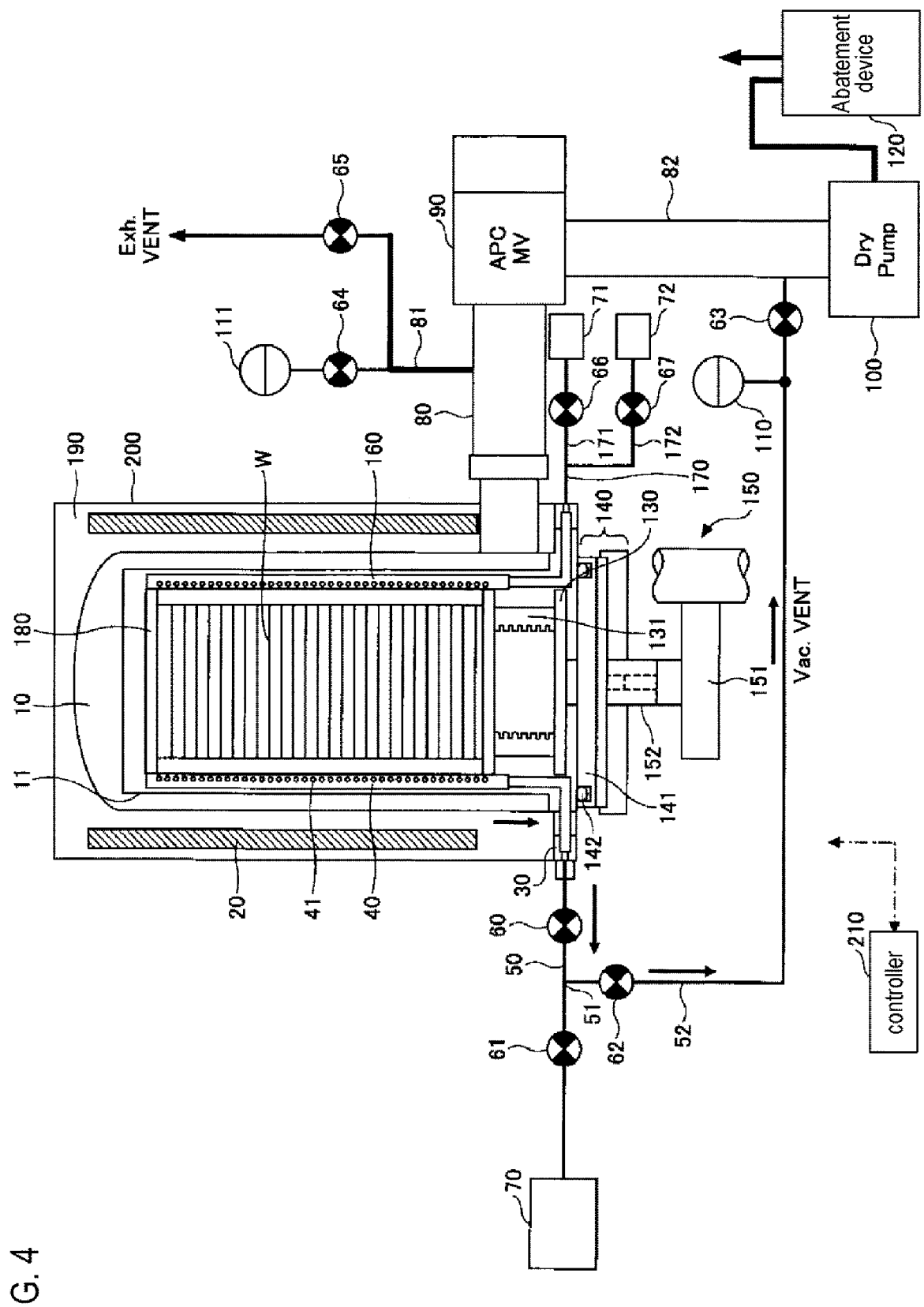
FIG. 4 is a view for explaining a method of coating particles in a process gas nozzle and a substrate processing method according to the present embodiment using a vertical heat treatment apparatus.

FIG. 4 is a view for explaining the method of coating particles in a process gas nozzle and the substrate processing method according to the present embodiment using the vertical heat treatment apparatus. In FIG. 4, constituent elements are the same as those illustrated in FIG. 1. Thus, the same constituent elements are denoted by like reference numerals, and the description of the same constituent elements are omitted.

As described above, the method of coating particles in a process gas nozzle according to the present embodiment is performed before the film-forming process. Thus, the method of coating particles in a process gas nozzle is performed in a state in which the wafers W are not loaded into the reaction tube 10 and in a state in which the lid 140 is closed.

In the method of coating particles in a process gas nozzle according to the present embodiment, first, the valve 61 is switched to a closed state and the valve 62 is switched to an open state. In addition, if the valve 63 is installed in the bypass pipe 52 and kept in a closed state, the valve 63 is switched to an open state. In other words, a connection path between the process gas nozzle 40 and the process gas supply source 70 is cut off by the valve 61. The valve 62 and the valve 63 are opened to form a connection path between the process gas nozzle 40 and the vacuum pump 100 via the bypass pipe 52. This makes it possible to evacuate the inside of the process gas nozzle 40 by the vacuum pump 100. Since the valve 60 is open during film formation, the valve 60 is kept open as it is. Accordingly, the valve 60 may not be present.

In addition, the automatic pressure control valve 90 is switched from an open state to a closed state. An exhausting from the exhaust pipe 80 is stopped. An exhausting is performed only from the process gas nozzle 40.

Then, at least one of a silicon-containing gas and an oxidizing gas is supplied from the coating gas nozzle 160. As the silicon-containing gas, various gasses containing an silicon element may be used. For example, a silane gas such as monosilane gas or disilane gas may be used as the silicon-containing gas. Furthermore, it may be possible to select a gas such as ozone gas, oxygen gas, water or the like as the oxidizing gas, depending on the use.

If the process gas nozzle 40 to be coated is a nozzle for supplying a raw material gas and a nozzle for supplying an oxidizing gas is present in another process gas nozzle 40, the oxidizing gas may be supplied from another process gas nozzle 40 and the silicon-containing gas may be supplied from the coating gas nozzle 160. As a result, the silicon-containing gas and the oxidizing gas supplied into the reaction tube 10 (more precisely, the inner tube 11) are sucked into the process gas nozzle 40 to form a $SiO_2$ coating film 220 on the inner wall of the process gas nozzle 40.

On the other hand, if the process gas nozzle 40 to be coated is a nozzle for supplying an oxidizing gas and a nozzle for supplying a silicon-containing gas is present in another process gas nozzle 40, the silicon-containing gas may be supplied from the other process gas nozzle 40 and the oxidizing gas may be supplied from the coating gas nozzle 160. Even in this case, it is possible to form a $SiO_2$ coating film 220 on the inner wall of the process gas nozzle 40.

Further, if neither a nozzle for supplying a silicon-containing gas nor a nozzle for supplying an oxidizing gas is included in a plurality of process gas nozzles 40, both the silicon-containing gas and the oxidizing gas may be supplied from the coating gas nozzle 160. In ALD film formation, different kinds of gasses are alternately supplied. Therefore, if the silicon-containing gas and the oxidizing gas are alternately supplied from one coating gas nozzle 160, it is possible to form a $SiO_2$ coating film 220 on the inner wall of the process gas nozzle 40 to be coated by the ALD film formation. Furthermore, the coating gas nozzle 160 for supplying the silicon-containing gas and the coating gas nozzle 160 for supplying the oxidizing gas may be separately installed to perform the ALD film formation.

The process gas nozzle 40 to be coated may be configured to be sequentially switched to be sequentially connected with the bypass pipe 52. That is, the coating the process gas nozzle 40 to be coated by connecting with the bypass pipe 52 may be carried out sequentially. Switching of a connection to the bypass pipe 52 can be easily performed by switching the valves or the like.

Further, a configuration may be adopted in which a plurality of process gas nozzles 40 can be simultaneously connected to one bypass pipe 52. This makes it possible to perform the coating of the plurality of process gas nozzles 40 at once to shorten a time period for the coating. The plurality of process gas nozzles 40 may all be connected to the bypass pipe 52. Alternatively, some of the process gas nozzles 40, for example, three process gas nozzles when twelve process gas nozzles exists, may be simultaneously connected to the bypass pipe 52. In either case, it is possible to shorten a time period for the coating.

Further, a plurality of bypass pipes 52 may be installed in one-to-one correspondence to the plurality of process gas nozzles 40 to form a $SiO_2$ coating film 220 inside all the process gas nozzles 40, simultaneously. In this case, although the number of the bypass pipes 52 increases, it is possible to form the $SiO_2$ coating films 220 inside all the process gas nozzles 40, simultaneously. This makes it possible to shorten a time period for the coating greatly.

In addition, instead of installing the bypass pipes 52 in one-to-one correspondence to the plurality of process gas nozzles 40, a half or a third (⅓) of the bypass pipes 52 may be installed such that the $SiO_2$ coating films 220 can be formed inside all the process gas nozzles 40 by performing the coating two or three times.

In this manner, a connection configuration of the process gas nozzle 40 to the bypass pipe 52 and the number of the bypass pipes 52 may be variously changed depending on applications.

After forming the SiO$_2$ coating film 220 in this manner, the valves 62 and 63 of the bypass pipe 52 are closed to cut off the connection of the bypass pipe 52.

Then, when a film-forming process is performed, the lid 140 is lowered. Then, the wafer boat 180 holding a plurality of wafers W is installed on the mounting stand 131, and loaded into the reaction tube 10, by raising the lid 140. The lid 140 is closed to hermetically seal the reaction tube 10.

Then, the automatic pressure control valve 90 is opened, and an evacuation of the interior of the reaction tube 10 is started.

When the interior of the reaction tube 10 reaches a predetermined pressure, the valve 61 is opened, the process gas is supplied from the process gas nozzle 40, and a film-forming process is performed. As described with reference to FIG. 2C, the particles P1 are fixed to the inner wall of the process gas nozzle 40. It is therefore possible to prevent the particles P1 from adversely affecting the film formation on the wafer W.

In the film-forming process, a purge gas supply nozzle may be appropriately installed in the inner tube 11, and a step of appropriately supplying a purge gas into the inner tube 11 may be included. Particularly, in the case of performing ALD film formation, it is often the case that a purge gas is supplied when the type of process gas to be supplied is changed. A rare gas such as Ar, He or the like may be used as the purge gas, in addition to nitrogen gas.

Upon completion of the film-forming process, the lid 140 is lowered to unload the wafer boat 180. Thereafter, if necessary, dry cleaning may be performed by tightly closing the lid 140 in a state in which the wafers W are not present.

The dry cleaning may be performed using, for example, a fluorine-containing gas such as HF or the like, or a fluorine gas and hydrogen. The dry cleaning may be performed by installing a dedicated gas nozzle inside the reaction tube 10 and supplying a fluorine-containing gas such as HF or the like as a cleaning gas from the gas nozzle. As a result, it is possible to remove the film 230 adhering to the inner wall of the process gas nozzle 40.

The dry cleaning may be performed either for each film formation or at a time when a predetermined film thickness is reached.

Then, by repeating the coating and the film formation again, it is possible to perform a film formation process while suppressing particles.

The coating process may be performed for each film formation process. However, if necessary, the coating process may be performed once when the film-forming process is performed several times. Such adjustment may be appropriately performed depending on applications.

In addition, the opening and closing of the valves 60 to 67 and the automatic pressure control valve 90 and an operation of the vacuum pump 100 may be controlled by the controller 210.

According to the substrate processing apparatus, the method of coating particles in a process gas nozzle and the substrate processing method according to the present embodiment, the inside of the process gas nozzle 40 made of quartz is coated with SiO$_2$ which is the same compound as quartz. It is therefore possible to fix the particles P1 and P2 inside the process gas nozzle 40 without affecting the process gas nozzle 40. This makes it possible to perform high quality substrate processing.

While some embodiments of the present disclosure have been described above, the present disclosure is not limited to the above-described embodiments. Various modifications and substitutions may be made to the above-described embodiments without departing from a scope of the present disclosure.

According to the present disclosure in some embodiments, it is possible to effectively suppress particles generated in a quartz gas nozzle for supplying process gas to a substrate processing apparatus.

While certain embodiments have been described, these embodiments have been presented as examples only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a process chamber in which a substrate is accommodated to be processed, the process chamber having an interior portion;
   a plurality of quartz gas nozzles configured to supply, into the process chamber, a plurality of process gasses capable of generating reaction products by reacting the plurality of process gasses with each other;
   an evacuation device configured to evacuate the interior portion of the process chamber;
   at least one bypass pipe configured to connect a quartz gas nozzle among the plurality of quartz gas nozzles to the evacuation device;
   at least one coating gas nozzle configured to supply, into the process chamber, at least one of a silicon-containing gas and an oxidizing gas capable of forming a SiO$_2$ coating film inside the quartz gas nozzle connected to the evacuation device in a state in which the inside of the quartz gas nozzle connected to the evacuation device is evacuated by the evacuation device;
   a process gas supply source; and
   a process gas supply pipe having a first valve and connected between each of the plurality of quartz gas nozzles and the process gas supply source,
   wherein the SiO$_2$ coating film is formed inside the quartz gas nozzle connected to the evacuation device by the at least one of the silicon-containing gas and the oxidizing gas supplied from the at least one coating gas nozzle,
   wherein the at least one bypass pipe has a second valve, branches from a branch point of the process gas supply pipe at a predetermined position closer to the process chamber than the first valve, and is connected to the evacuation device, and
   wherein an interior of the quartz gas nozzle connected to the evacuation device is evacuated by the evacuation device by closing the first valve and opening the second valve.

2. The substrate processing apparatus of claim 1, wherein the quartz gas nozzle connected to the evacuation device supplies a silicon-containing gas for film formation as a process gas, and the at least one coating gas nozzle supplies the silicon-containing gas.

3. The substrate processing apparatus of claim 1, wherein the quartz gas nozzle connected to the evacuation device supplies an oxidizing gas for film formation as a process gas, and the at least one coating gas nozzle supplies the oxidizing gas.

4. The substrate processing apparatus of claim 1, wherein the quartz gas nozzle connected to the evacuation device supplies gas other than a silicon-containing gas for film formation or an oxidizing gas for film formation as a process gas, and the at least one coating gas nozzle supplies the silicon-containing gas and the oxidizing gas.

5. The substrate processing apparatus of claim 4, wherein the at least one coating gas nozzle forms the $SiO_2$ coating far by ALD (Atomic Layer Deposition) film formation, by alternately supplying the silicon-containing gas and the oxidizing gas.

6. The substrate processing apparatus of claim 5, further comprising:
a controller configured to switch the supply of the silicon-containing gas and the supply of the oxidizing gas.

7. The substrate processing apparatus of claim 4, wherein the at least one coating gas nozzle includes a first coating gas nozzle configured to supply the silicon-containing gas into the process chamber and a second coating gas nozzle configured to supply the oxidizing gas into the process chamber.

8. The substrate processing apparatus of claim 1, wherein each of the plurality of quartz gas nozzles is further configured to be switched to be connected with the at least one bypass pipe, such that the plurality of quartz gas nozzles are coated by sequentially switching the plurality of quartz gas nozzles.

9. The substrate processing apparatus of claim 1, wherein the at least one bypass pipe includes a plurality of bypass pipes installed corresponding to the plurality of quartz gas nozzles, such that the plurality of quartz gas nozzles are coated simultaneously.

10. The substrate processing apparatus of claim 1, wherein the process chamber and the evacuation device are connected via an exhaust pipe, and
wherein the at least one bypass pipe is connected to the exhaust pipe.

11. The substrate processing apparatus of claim 10, wherein an exhaust valve is installed at the exhaust pipe, and
wherein the exhaust valve is closed when the evacuation device evacuates the inside of the quartz gas nozzle connected to the evacuation device.

12. The substrate processing apparatus of claim 1, further comprising:
a substrate holder configured to hold a plurality of substrates in a horizontal state and spaced apart along a vertical direction; and
a heater installed around the process chamber and configured to perform a heat treatment to the substrate,
wherein the process chamber has a vertically elongated substantially cylindrical shape,
wherein the plurality of quartz gas nozzles are installed to extend vertically along an inner circumferential surface of the process chamber, and
wherein the substrate is mounted on the substrate holder.

* * * * *